United States Patent
Rumer et al.

(10) Patent No.: US 6,748,350 B2
(45) Date of Patent: Jun. 8, 2004

(54) METHOD TO COMPENSATE FOR STRESS BETWEEN HEAT SPREADER AND THERMAL INTERFACE MATERIAL

(75) Inventors: Christopher L. Rumer, Chandler, AZ (US); Sabina J. Houle, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/963,438

(22) Filed: Sep. 27, 2001

(65) Prior Publication Data

US 2003/0058620 A1 Mar. 27, 2003

(51) Int. Cl.$^7$ .................................................. G06G 7/48
(52) U.S. Cl. ....................... 703/9; 703/1; 703/5; 703/12; 438/118; 438/122; 257/706; 257/709; 361/704; 361/709; 361/705; 374/43; 374/44; 374/57
(58) Field of Search ................................. 703/1, 5, 6, 7, 703/9, 12, 13, 18; 361/704, 709, 717, 718, 760, 719; 257/701, 708, 706, 707, 709, 718; 374/57, 43, 46, 47, 44, 49; 702/132, 136, 131; 438/118, 122

(56) References Cited

U.S. PATENT DOCUMENTS

| | | | |
|---|---|---|---|
| 4,683,750 A | * 8/1987 | Kino et al. ..................... 73/606 |
| 5,367,196 A | * 11/1994 | Mahulikar et al. ............ 257/706 |
| 5,402,006 A | * 3/1995 | O'Donley .................... 257/706 |
| 5,591,034 A | * 1/1997 | Ameen et al. ................ 29/829 |
| 5,749,988 A | * 5/1998 | Leibovitz et al. .......... 156/307.5 |
| 5,834,339 A | * 11/1998 | Distefano et al. ............ 438/118 |
| 5,847,929 A | * 12/1998 | Bernier et al. ............... 361/706 |
| 6,002,171 A | * 12/1999 | Desai et al. ................. 257/706 |
| 6,091,603 A | * 7/2000 | Daves et al. ................. 257/706 |
| 6,117,695 A | * 9/2000 | Murphy et al. .............. 438/108 |
| 6,169,328 B1 | * 1/2001 | Mitchell et al. ............. 257/719 |
| 6,188,582 B1 | * 2/2001 | Peter .......................... 257/703 |
| 6,238,086 B1 | * 5/2001 | Mikubo et al. ............... 374/43 |
| 6,288,900 B1 | * 9/2001 | Johnson et al. ............. 257/706 |
| 6,333,551 B1 | * 12/2001 | Caletka et al. .............. 257/706 |
| 6,396,700 B1 | * 5/2002 | Chu et al. .................... 257/707 |

OTHER PUBLICATIONS

"FLomerics Incroduces FLOPACK for the Thermal Modeling of Electronic Packages", Oct. 1998.*
Valenta, "Thermal Modeling of Ball Grid Arrarys", Sep. 1996.*
Cheng et al., "iCET: A Complete Chip Level Thermal Reliability Diagnosis Tool for CMOS VLSI", ACM 1996.*
Bosak, "A3–D thermal Analysis of Microprocessors", FLO-THERM International USER Conference Presentations, May 1993.*
Mansingh et al., thermal Analysis of a Pin Grid Array Package, Flomerics, 1993.*
Burdick, "Electronic Cooling at IBM Endicott", IBM, Aug. 1991.*
Jeakins, "Thermal Analysis of a Ceramic Microelectronics Package Using Flotherm", FLOTHERM International User Conferenc Presentations, May 1993.*
Rosten et al., "DELPHI: The Development of Libraries of Physical Components for an Integrated Design Environment", Flomerics, 1996.*

(List continued on next page.)

Primary Examiner—W. Thomson
(74) Attorney, Agent, or Firm—Schwegman, Lundberg, Woessner & Kluth, P.A.

(57) ABSTRACT

A device and method identify and compensate for tensile and/or shear stress due to heat-caused expansion and contraction between an integrated heat spreader and thermal interface material. This device and method may change the shape of the integrated heat spreader based upon the identification of location(s) of high tensile and/or shear stress so that additional thermal interface material may be deposited between the integrated heat spreader and a die in corresponding locations. Utilizing this method and device, heat is efficiently transferred from the die to the integrated heat spreader.

12 Claims, 5 Drawing Sheets

OTHER PUBLICATIONS

Rosten et al., "Final Reports to SEMITHERM XIII on the European Funded Project DELPHI the Development of Libraries and Physical Models for an Integrated Design Environment", Flomerics, 1996.*

Ashium Haque, "Processing and Characterization of Device Solder Interconnection and Module Attach for Power Electronics Modules", Chapter 4, pp. 71–108, Dec. 1999.*

Kromann, Gary B., "Thermal Modeling and Experimental Characterization of the C4/Surface–Mount–Array Interconnect Technologies", *IEEE Transactions on Components, Packaging, and Manufacturing Technology*, Part A, vol. 18, No. 1, (Mar. 1995), pp. 87–93.

* cited by examiner

METHOD TO COMPENSATE FOR STRESS BETWEEN HEAT SPREADER AND THERMAL INTERFACE MATERIAL

FIELD

The inventive subject matter relates to a device and method to control strain and tensile stress on thermal interface material in a heat spreader. More particularly, the inventive subject matter pertains to a device and method that determine stress points in thermal interface material used to transfer heat from a die to a heat spreader and design the heat spreader to optimize the thickness of thermal interface material for those stress points.

BACKGROUND

In the rapid development of computers many advancements have been seen in the areas of processor speed, throughput, communications, fault tolerance and size of individual components. Today's microprocessors, memory and other chips have become faster and smaller. However, with the increase in speed, reduction in the size of components, and increased density of circuitry found within a given chip/die, heat generation and dissipation have become more critical factors than ever.

Figure 1:
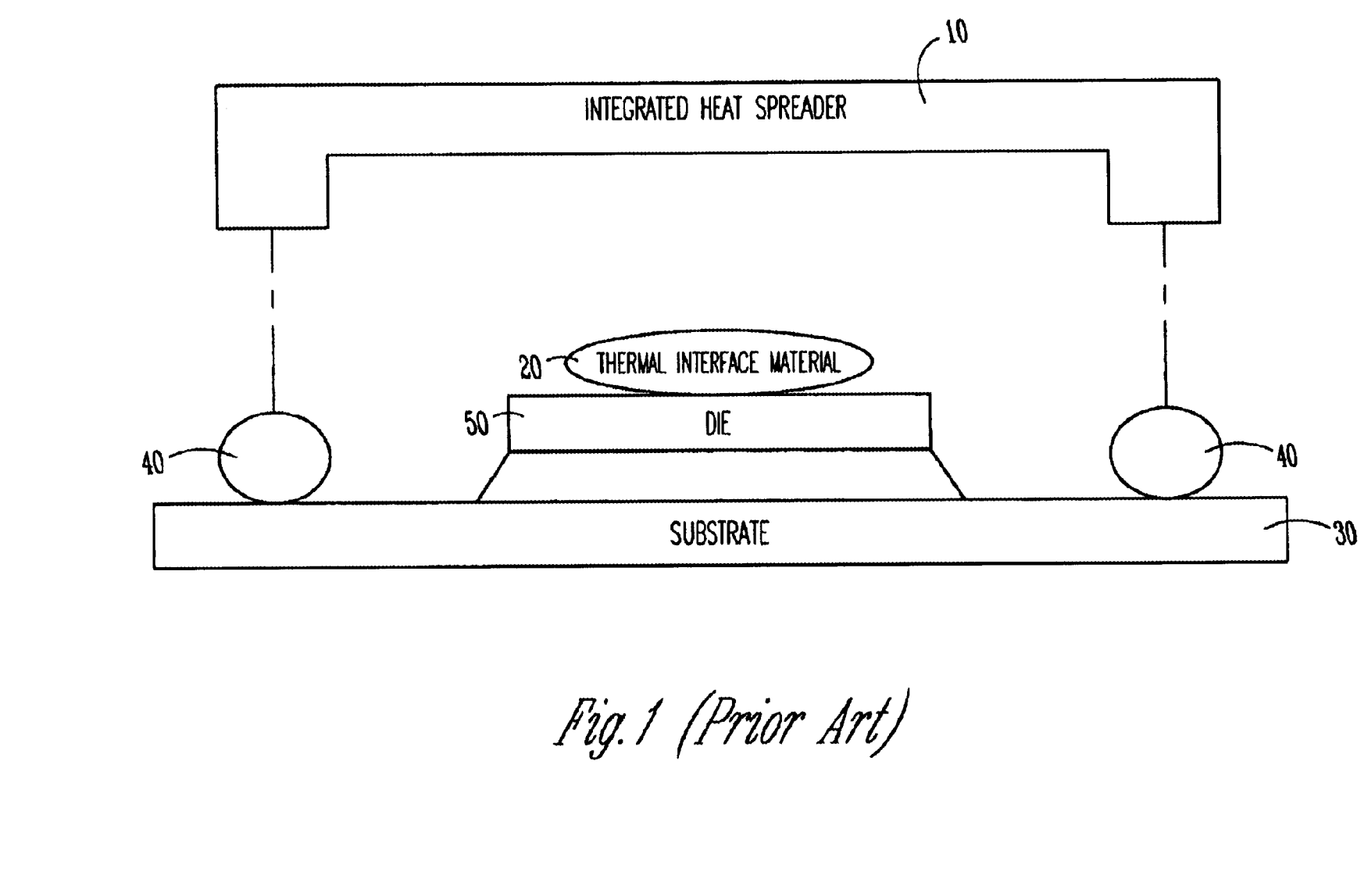
FIG. 1 is an example of an integrated heat spreader (IHS) being affixed to a die attached to a substrate.

FIG. 1 illustrates a die 50 placed on a substrate 30 with a finite amount of a thermal interface material (TIM) 20 placed on top of the die 50. This TIM 20 serves at least two primary purposes. First, it acts to conduct heat from the die to the integrated heat spreader (IHS) 10. Second, it may also provide some adhesion between the IHS 10 and die 50. The TIM 20 may be composed of, but not be limited to, solder, a polymer containing metal, or some other substances which both act to transfer heat and provide some adhesion. During the manufacturing process the IHS 10 is pressed down upon the TIM 20 and adhesive 40, resulting in a structure as shown in FIG. 2.

Figure 2:
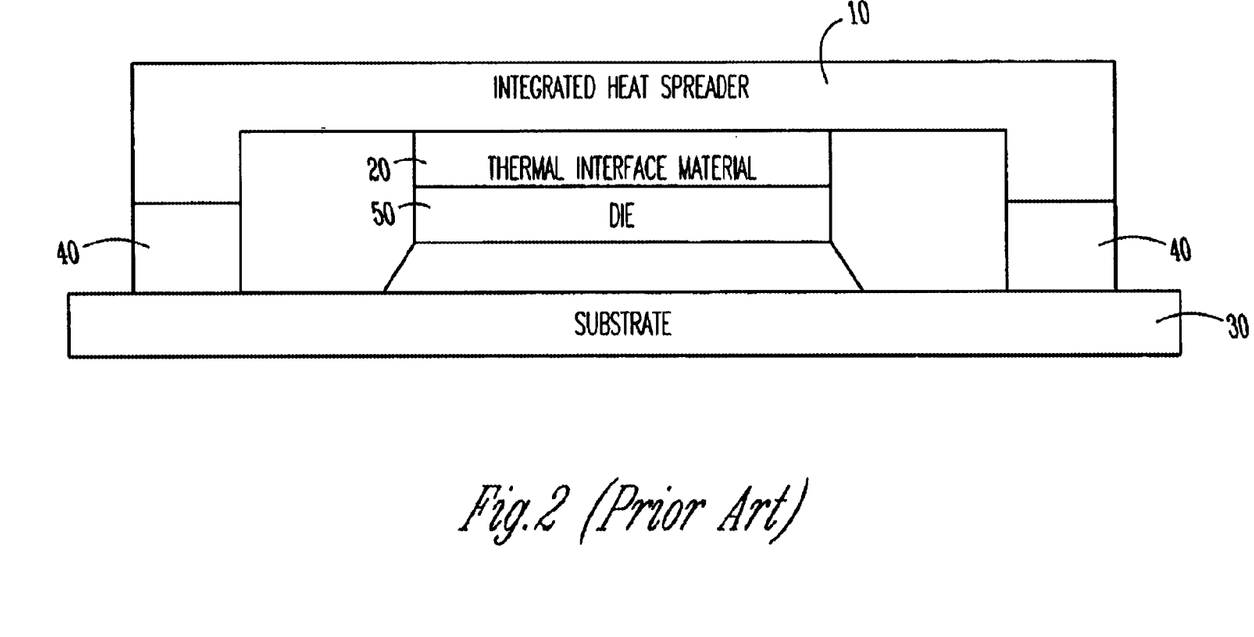
FIG. 2 is an example of an assembled integrated heat spreader (IHS) and die with a thermal interface material (TIM) to conduct heat from the die to the integrated heat spreader (IHS)
Figure 3:
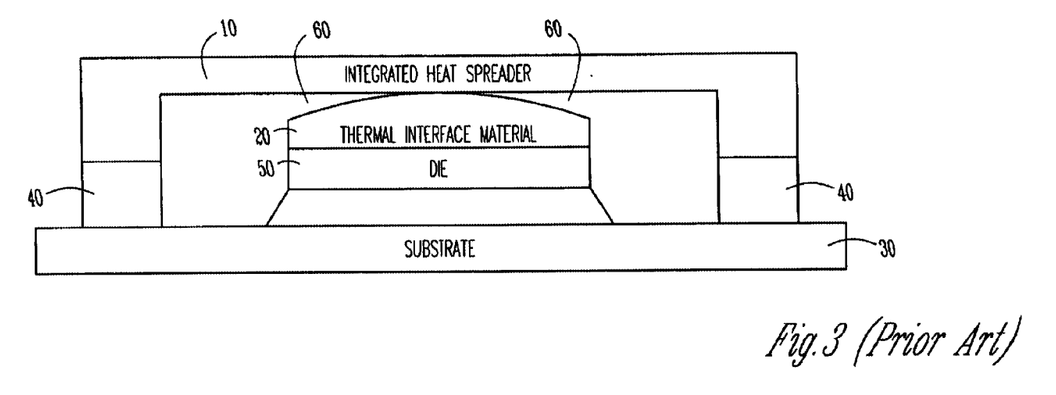
FIG. 3 is an example of an assembled IHS and die with a TIM that has separated from the IHS to form air gaps.

As shown in FIG. 2, the IHS 10 would absorb heat from die 50 through TIM 20 and be held in place on the substrate 30 via adhesive 40. On top of the IHS 10 a heat sink (not shown) or fan/heat sink combination (not shown) would be mounted to dissipate the heat absorbed by the IHS 10. However, since IHS 10 and TIM 20 both experience significant tensile stress during the assembly process and due to thermal expansion and contraction when the die is powered on and off, as shown in FIG. 3, air gaps 60 form between the TIM 20 and IHS 10. As indicated in FIG. 3, these air gaps 60 may form at the outer edges of the TIM 20 while the center portion of the TIM 20 remains in contact with the IHS 10.

Figure 4:
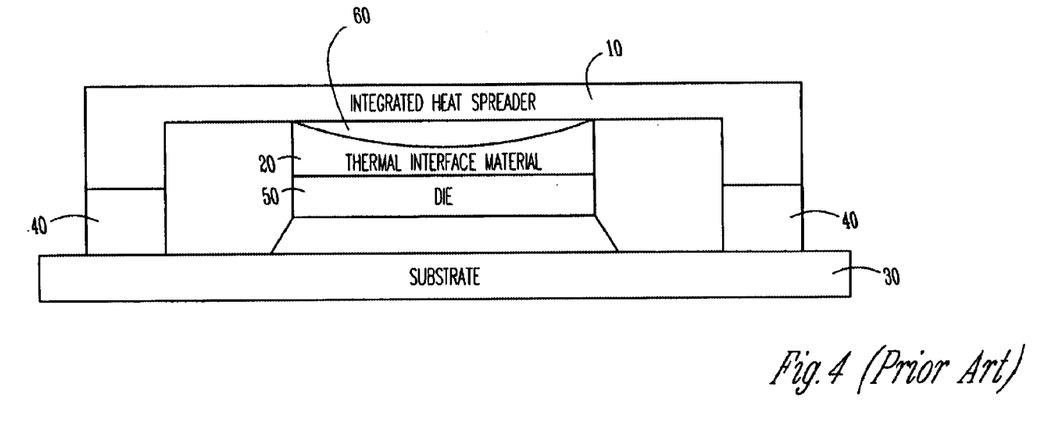
FIG. 4 is an example of an assembled IHS and die with a TIM that has separated from the IHS to form an air gap.

However, as shown in FIGS. 3 and 4, an air gap 60 may occur anywhere in the contact area between TIM 20 and IHS 10. As illustrated in FIG. 4, an air gap 60 may form in the center of the contact area between the TIM 20 and IHS 10, while the outer edges of the TIM 20 remain in contact with the IHS 10.

As would be appreciated by one of ordinary skill in the art, these air gaps 60 shown in FIGS. 3 and 4 may form anywhere in the contact area between the TIM 20 and IHS 10 depending on the materials utilized in the IHS 10 and TIM 20 as well as the handling procedures for the IHS 10 during the manufacturing process. Further, these air gaps 60 may also form in the TIM 20 itself. It should be noted that FIGS. 3 and 4, except for the inclusion of air gaps 60, remain unchanged from that shown in FIG. 2 and will not be discussed in further detail.

Since separation may occur between the TIM 20 and IHS 10, forming air gaps 60, as shown in FIGS. 3 and 4, due to thermal expansion and contraction, these air gaps 60 act as insulation, preventing heat being transferred from the die 50 to the IHS 10. As heat builds up in the die 50 to higher levels, the life expectancy of the die 50 is reduced.

Therefore, what are needed are a device and method that can determine the stress points between the TIM 20 and IHS 10 due to thermal expansion and contraction. Further, what are needed are a device and method that may compensate for the tensile and shear stress, thereby preventing the separation of the TIM 20 and the IHS 10. Still further, what are needed are a device and method that will provide for efficient heat transfer from the die 50 to the IHS 10.

BRIEF DESCRIPTION OF THE DRAWINGS

The foregoing and a better understanding of the inventive subject matter will become apparent from the following detailed description of exemplary embodiments and the claims when read in connection with the accompanying drawings, all forming a part of the disclosure of this inventive subject matter. While the foregoing and following written and illustrated disclosure focus on disclosing example embodiments of the invention, it should be clearly understood that the same is by way of illustration and example only and the invention is not limited thereto. Such embodiments of the inventive subject matter may be referred to, individually and/or collectively, herein by the term "invention" merely for convenience and without intending to voluntarily limit the scope of this application to any single invention or inventive concept if more than one is in fact disclosed. The spirit and scope of embodiments of the present invention are limited only by the terms of the appended claims.

The following represent brief descriptions of the drawings, wherein.

DETAILED DESCRIPTION

Before beginning a detailed description of the subject invention, mention of the following is in order. When appropriate, like reference numerals and characters may be used to designate identical, corresponding or similar components in differing figure drawings. Further, in the detailed description to follow, exemplary sizes/models/values/ranges may be given, although the present invention is not limited to the same. As a final note, well-known components of computer networks may not be shown within the FIGS. for simplicity of illustration and discussion, and so as not to obscure the invention.

Figure 5:
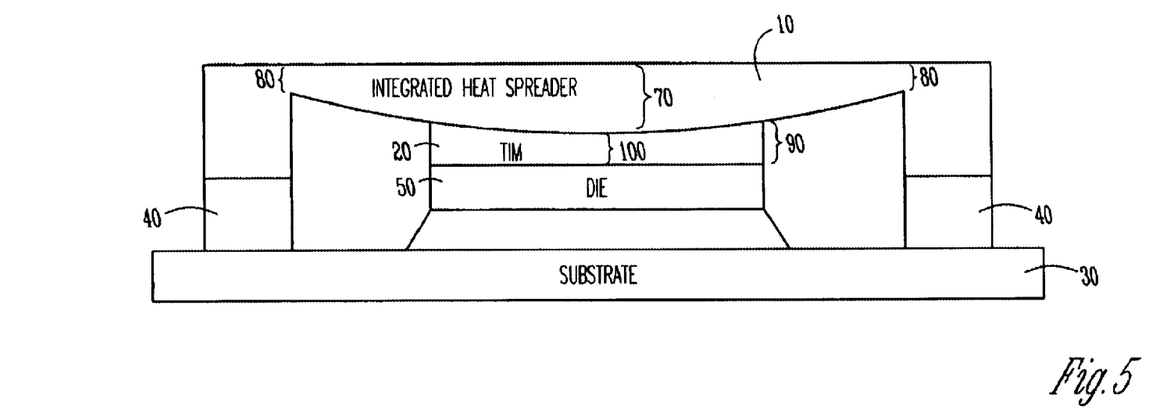
FIG. 5 is an assembled convex IHS in an example embodiment of the present invention.
Figure 6:
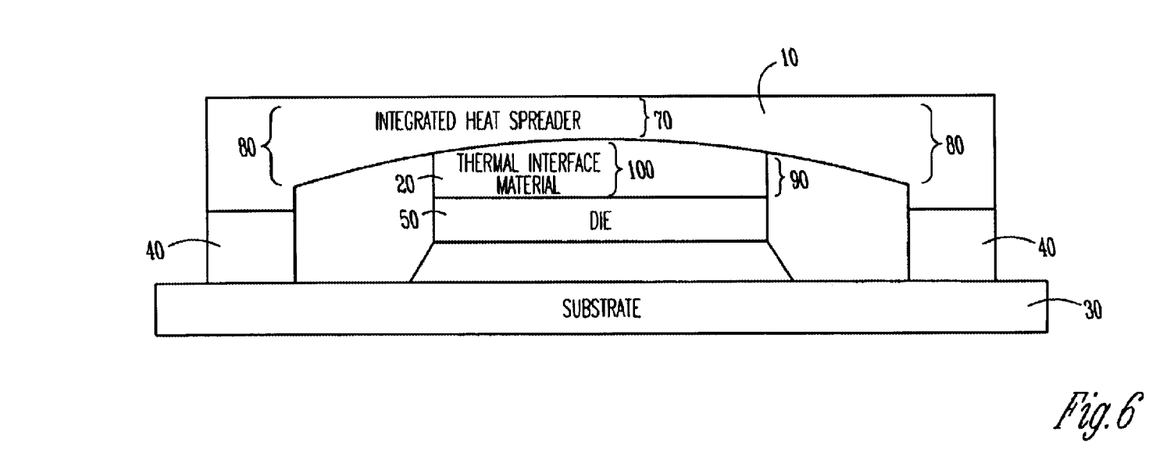
FIG. 6 is an assembled concave IHS in an example embodiment of the present invention.

FIG. 5 is an assembled convex IHS 10 in an example embodiment of the present invention. It should be noted that FIGS. 5 and 6 are provided as merely example embodiments of the present invention. As previously discussed, with reference to FIGS. 3 and 4, depending on the material composition of the integrated heat spreader (IHS) 10 and the thermal interface material (TIM) 20, air gaps 60 may form anywhere in the interface between the TIM 20 and IHS 10 due to separation of TIM 20 from IHS 10 caused by thermal expansion and contraction. Further, as previously discussed, air gaps may also form in the TIM 20 itself.

Still referring to FIG. 5, it should be noted that IHS 10 has a convex shape in which the middle portion 70 of the IHS 10 is thicker/wider than the end portions 80 of the IHS 10. This convex shape of the IHS 10 is done in order to increase the thickness of the TIM 20 at both its respective ends 90 while allowing the middle section 100 to remain unchanged in thickness, so that the air gaps seen in FIG. 3 are less likely to materialize. This is due to the fact that as the thickness of the TIM 20 increases so does its elasticity, and therefore it can better withstand the thermal stresses causing detachment as shown in FIG. 3. This is particularly true in the case where the TIM 20 is made of a polymer-metal combination or where the TIM 20 comprises a solder composite material. However, as previously discussed, this particular embodiment of the present invention shown in FIG. 5 is specifically designed to alleviate the detachment problems as shown in FIG. 3 and is merely provided as an example embodiment of the present invention. Those features not discussed in reference to FIG. 5 remain unchanged from those in FIGS. 2 and 3.

FIG. 6 is an assembled concave IHS 10 in which the center portion 70 is thinner and the end portions 80 are thicker or remain unchanged in size in an example embodiment of the present invention. This concave shape of the IHS 10 is done in order to increase the thickness of the TIM 20 in its center portion 100 while maintaining both end portions 90 at near the same size, so that the air gap seen in FIG. 4 is less likely to materialize. This is due to the fact that as the thickness of the TIM 20 increases so does its elasticity, and therefore it can better withstand the thermal stresses causing detachment as shown in FIG. 4. This is particularly true in the case where the TIM 20 is made of a polymer-metal combination or where the TIM 20 comprises a solder composite material. However, as previously discussed, this particular embodiment of the present invention shown in FIG. 6 is specifically designed to alleviate the detachment problems as shown in FIG. 4 and is merely provided as an example embodiment of the present invention. Those features not discussed in reference to FIG. 6 remain unchanged from those in FIGS. 2 and 4.

Figure 7:
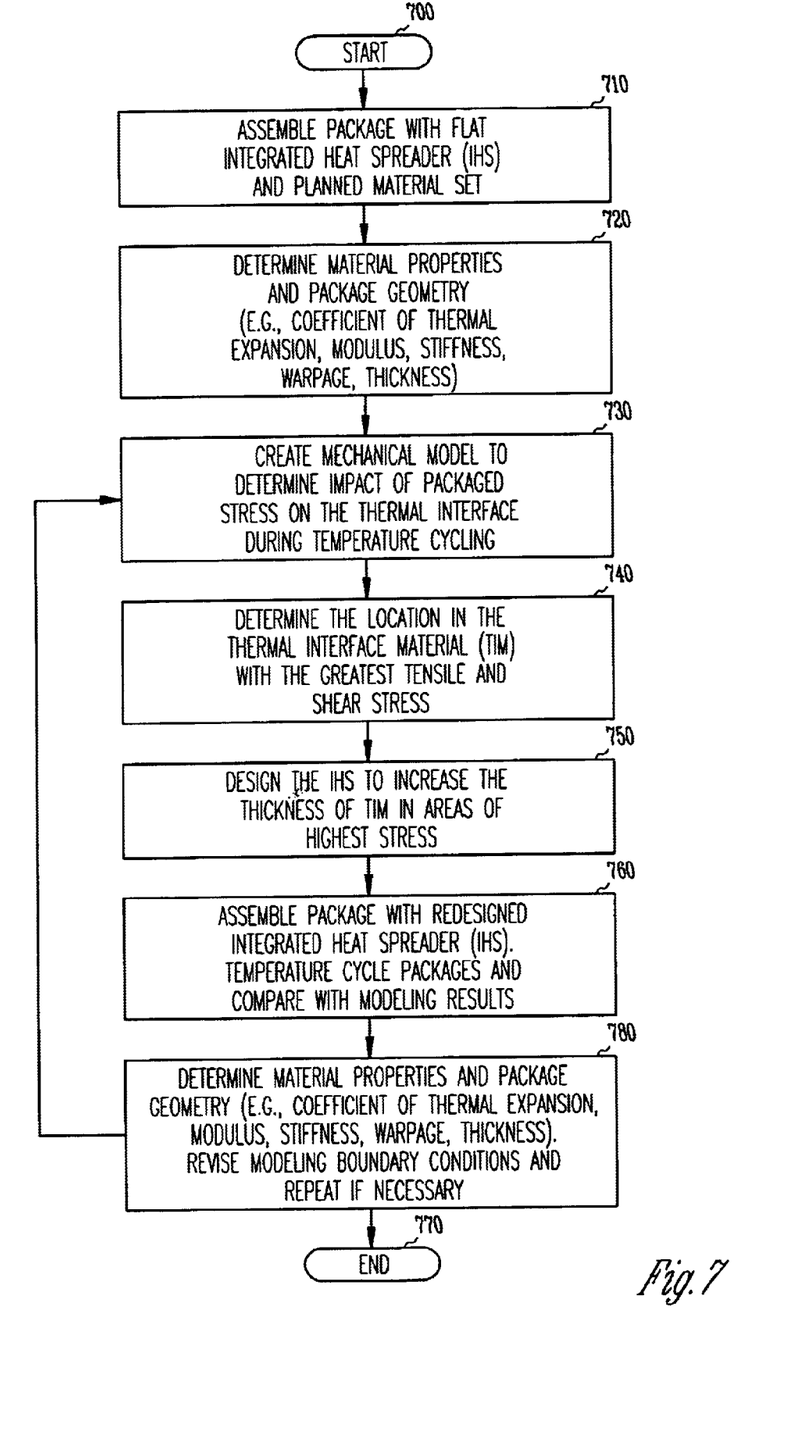
FIG. 7 is a flowchart of a process to determine the stress points in a TIM and modify the IHS to compensate for the stress points in an example embodiment of the present invention.

FIG. 7 is a flowchart of a process to determine the stress points in a TIM 20 and to modify the IHS 10 to compensate for the stress points in an example embodiment of the present invention. Processing begins in operation 700 and immediately proceeds to operation 710. In operation 710 the assembly package having a flat IHS 10 and using factory materials is assembled as shown in FIG. 2. In operation 720, the material properties and package geometry are determined. This would include determining such factors as coefficient of thermal expansion, modulus, stiffness, warpage, thickness, etc. Thereafter, in operation 730 a mechanical model is created to determine the impact of package stress on the thermal interface material (TIM) 20 during temperature cycling. This mechanical model would comprise building a statistically significant number of the packages and then cycling them through the temperature extremes that would be experienced during a normal lifetime of operation. Thereafter, in operation 740 the location in the TIM 20 that has the greatest tensile and shear stress applied there to is determined. As would be appreciated by one of ordinary skill in the art, this may be determined in a number of ways. For example, cross-sections of the assembled die 50, substrate 30 and IHS 10 may be examined, photographed and the location of the amount of separation determined. In addition, as would be appreciated by one of ordinary skill in the art, acoustic and x-ray analysis may be used to determine the location of any separation or any air gaps that form in the TIM 20. In operation 750, the IHS 10 is redesigned to increase the thickness of the TIM 20 in the areas of high stress as evidenced by separation points discovered in operation 740. In operation 760 the package is assembled with the redesigned integrated heat spreader (IHS) 10, is manufactured in sufficient quantity to provide statistically significant data, and is then retested in temperature cycling while being compared with the modeled results. Thereafter, in operation 780 the material properties and package geometry of the IHS 10, TIM 20 and die 50 are determined. The material properties would include, but not be limited to, the coefficient of thermal expansion, modulus, stiffness, warpage, thickness, and etc. If the material properties are within predetermined desired limits, then processing proceeds to operation 770 where processing terminates. However, if the material properties are not within the required tolerances, then processing loops back to operation 730 and repeats operations 730 through 780 until the material properties fall within specified limits.

The benefit resulting from the present invention is that a simple, reliable, device and method are provided for identifying and compensating for stress points that develop between an IHS 10 and TIM 20 that cause air gaps 60 to form and prevent effective heat transfer from a die 50 to an IHS 10. This device and method compensate for tensile and shear stress due to heating-related expansion and contraction by placing larger quantities of the TIM 20 at those tensile stress points, thereby increasing the elasticity of the TIM 20 at those tensile stress points.

While we have shown and described only a few examples herein, it is understood that numerous changes and modifications as known to those skilled in the art could be made to the example embodiments of the present invention. Therefore, we do not wish to be limited to the details shown and described herein, but intend to cover all such changes and modifications as are encompassed by the scope of the appended claims.

We claim:

1. A method comprising;

placing first thermal interface material on a first die of a given type;

coupling a first integrated heat spreader having a flat bottom surface to the first thermal interface material to form a first package, the first thermal interface material having a constant thickness in a contact area between the first die and the bottom surface of the first integrated heat spreader;

exposing the first package to temperature cycling;

determining at least one location in the first thermal interface material with high tensile and shear stress;

altering to shape of a second integrated heat spreader bottom surface to provide a concave shape;

placing second thermal interface material on a second die of the given type; and coupling the second integrated heat spreader having a concave bottom surface to the second thermal interface material to form a second package, wherein the concave bottom surface allows an increase in to thickness of the second thermal interface material in a center portion of the contact area between the second die and the second integrated heat spreader at the at least one location in to thermal interface material with high tensile and shear stress.

2. The method recited in claim 1, further comprising:
determining material properties and geometry of the first and second packages.

3. The method recited in claim 2, wherein determining the material properties and geometry of the first and second packages comprises:
determining the coefficient of thermal expansion, modulus, stiffness, warpage, and thickness of the respective integrated heat spreader and the thermal interface material of the first and second packages.

4. The method recited in claim 1, wherein determining at least one location in the first thermal interface material with high tensile and shear stress comprises:
taking cross-sections, acoustic analysis, or x-ray failure analysis of the first integrated heat spreader and the first thermal interface material, measuring any seperation between the first integrated heat spreader and first thermal interface material, and locating any air gaps formed in the first thermal interface material.

5. The method recited in claim 1, further comprising:
exposing the second package to temperature cycling.

6. The method recited in claim 5, wherein, after temperature cycling of the second package, the method further comprising:
determining the material properties and geometry of the second integrated heat spreader and the second thermal interface material; and
determining whether separation of the second integrated heat spreader and the second thermal interface material has occurred or air gaps have formed in the second thermal interface material.

7. A method comprising:
creating a first package by placing first thermal interface material on a die of a given type and coupling the bottom of a first integrated heat spreader to the first thermal interface material to form a first interface between the first integrated heat spreader and the first thermal interface material, wherein the bottom of the first integrated heat spreader is flat;
exposing the first package to temperature cycling;
determining at least one location of the first interface having a level of tensile and shear stress that is greater than levels of tensile and shear stress at other locations of the first interface;
altering the shape of a subsequent integrated heat spreader bottom surface to provide a non-convex shape;
creating a subsequent package by placing subsequent thermal interface material on another die of the given type and coupling the bottom of the subsequent integrated heat spreader to the subsequent thermal interface material to form a subsequent interface between the subsequent integrated heat spreader and the subsequent thermal interface material, wherein the non-convex bottom surface allows an increase in the thickness of the subsequent thermal interface material in a portion of to subsequent interface at the at least one location in the thermal interface material with high tensile and shear stress;
exposing the subsequent package to temperature cycling; and
testing whether material properties and geometry of the subsequent package are within desired limits and,
if so, ending the method;
otherwise, determining at least on location of the subsequent interface having a level of tensile and shear stress that is greater than levels of tensile and shear stress at other locations of the subsequent interface, and repeating the operations of altering through testing until the material properties and geometry of the subsequent package are within desired limits.

8. The method recited in claim 7, wherein the bottom surface of the subsequent integrated heat spreader has a concave shape.

9. The method recited in claim 7, further comprising:
determining material properties and geometry of the first and subsequent packages.

10. The method recited in claim 9, wherein determining the material properties and geometry of the first and subsequent packages comprises:
determining the coefficient of thermal expansion, modulus, stiffness, warpage, and thickness of the respective integrated heat spreader and the thermal interface material of the first and subsequent packages.

11. The method recited in claim 7, wherein determining at least one location in the first thermal interface material with high tensile and shear stress comprises:
taking cross-sections, acoustic analysis, or x-ray failure analysis of the first integrated heat spreader and the first thermal interface material, measuring any separation between the first integrated heat spreader and the first thermal interface material, and locating any air gaps formed in the first thermal interface material.

12. The method recited in claim 7, wherein determining at least one location in the subsequent thermal interface material with high tensile and shear stress comprises:
taking cross-sections, acoustic analysis, or x-ray failure analysis of the subsequent integrated heat spreader and the subsequent thermal interface material, measuring any separation between the subsequent integrated heat spreader and the subsequent thermal interface material, and locating any air gaps formed in the subsequent thermal interface material.

* * * * *

UNITED STATES PATENT AND TRADEMARK OFFICE
CERTIFICATE OF CORRECTION

PATENT NO. : 6,748,350 B2
DATED : June 8, 2004
INVENTOR(S) : Rumer et al.

It is certified that error appears in the above-identified patent and that said Letters Patent is hereby corrected as shown below:

Title page, Item [54] and Column 1, line 1,
Title, delete "METHOD" and insert -- METHODS --.

Title page,
Item [56], References Cited, OTHER PUBLICATIONS,
"Valenta" reference, delete "Arrarys" and insert -- Arrays --.

Column 4,
Line 52, delete ";" and insert -- : --.
Line 64, delete "to" and insert -- the --.

Column 5,
Lines 4 and 8, delete "to" and insert -- the --.

Column 6,
Line 8, delete "to" and insert -- the --.
Line 17, delete "on" and insert -- one --.

Signed and Sealed this

Fourteenth Day of March, 2006

JON W. DUDAS
*Director of the United States Patent and Trademark Office*